(12) United States Patent
Blumberg et al.

(10) Patent No.: US 6,841,026 B2
(45) Date of Patent: Jan. 11, 2005

(54) METHOD FOR REDUCING COEFFICIENT OF THERMAL EXPANSION IN CHIP ATTACH PACKAGES

(75) Inventors: Lawrence Robert Blumberg, Johnson City, NY (US); Robert Maynard Japp, Vestal, NY (US); William John Rudik, Vestal, NY (US); John Frank Surowka, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 302 days.

(21) Appl. No.: 10/107,112

(22) Filed: Mar. 26, 2002

(65) Prior Publication Data

US 2003/0000081 A1 Jan. 2, 2003

Related U.S. Application Data

(62) Division of application No. 09/265,210, filed on Mar. 10, 1999, now Pat. No. 6,387,830, which is a division of application No. 08/874,902, filed on Jun. 13, 1997, now Pat. No. 6,136,733.

(51) Int. Cl.[7] .............................................. B32B 31/04
(52) U.S. Cl. ...................... 156/285; 156/166; 442/103; 442/180; 442/247; 442/251; 442/255; 442/252; 442/253; 442/262
(58) Field of Search ................................ 442/103, 180, 442/247, 251, 255, 252, 253, 262; 156/285, 166

(56) References Cited

U.S. PATENT DOCUMENTS

| | | | | |
|---|---|---|---|---|
| 3,987,230 A | * | 10/1976 | Gaku et al. | 442/235 |
| 4,414,264 A | * | 11/1983 | Olson | 442/212 |
| 4,428,995 A | * | 1/1984 | Yokono et al. | 428/193 |
| 4,513,055 A | * | 4/1985 | Leibowitz | 442/212 |
| 4,650,922 A | * | 3/1987 | McPherson | 174/52.4 |
| 5,217,796 A | * | 6/1993 | Kasai et al. | 442/186 |
| 5,350,621 A | * | 9/1994 | Yuhas et al. | 428/209 |
| 5,401,349 A | * | 3/1995 | Goetz et al. | 156/286 |

FOREIGN PATENT DOCUMENTS

| | | | | |
|---|---|---|---|---|
| FR | 2224293 | * | 10/1974 | 156/295 |
| FR | 2224293 A | * | 12/1974 | B32B/17/04 |

OTHER PUBLICATIONS

IBM Research Disclosure N252 04–85 "Dry Process of Laminating Boards" by Chellis, et al, Apr. 1985.*
IBM TEchnical Disclosure Bulletin 09–84 p. 1964, "Substrate for Surface Solder Devices" by Chellis, et al.*
IBM Technical Bulletin 04–78, "Prepreg Manufacturing Process" by Haining, et al.*
IBM Research Disclosure N252 04–85 "Dry Process for Laminating Boards" by Chellis, et al. Apr. 1985.
IBM Technical Disclosure Bulletin 09–84 p. 1964, "Substrate for Surface Solder Devices" by Chellis, et al.
IBM Technical Disclosure Bulletin 04–78, "Prepreg Manufacturing Process" by Haining, et al.

* cited by examiner

*Primary Examiner*—Elizabeth M. Cole
(74) *Attorney, Agent, or Firm*—Patrick J. Daugherty; Driggs, Lucas, Brubaker & Hogg Co., LPA

(57) ABSTRACT

A simple, inexpensive, drillable, reduced CTE laminate and circuitized structures comprising the reduced CTE laminate, is provided. One embodiment of the reduced CTE laminate comprises: from about 40% to 75%, preferably from about 55% to 65%, by weight resin; from about 0.05% to 0.3%, preferably from about 0.08% to 0.10%, by weight curing agent; from about 25% to 60%, preferably from about 30% to 40%, by weight, woven cloth; from about 1% to 15%, preferably from about 5% to 10%, by volume, non-woven quartz mat. The method for making reduced CTE laminate and laminate structures comprises the following steps: providing non-woven quartz mat; providing a prepreg, preferably B-stage cured to not more than about 40%, preferably not more than 30% of full cure; sandwiching the non-woven quartz mat between two layers of prepreg, and reflowing the resin of the prepreg into the quartz mat.

18 Claims, 2 Drawing Sheets

METHOD FOR REDUCING COEFFICIENT OF THERMAL EXPANSION IN CHIP ATTACH PACKAGES

RELATED APPLICATIONS

This application is a divisional of application Ser. No. 09/265,210, filed on Mar. 10, 1999, now U.S. Pat. No. 6,387,830, which is a divisional application of Ser. No. 08/874,902, filed on Jun. 13, 1997, now U.S. Pat. No. 6,136,733.

The presence of different materials within a chip attach package, leads to different coefficients of thermal expansion within the package. The differential expansion can cause warpage within these packages, including flip chip attach packages. This warpage can fatigue chip attach joints and also cause chip cracking.

Attempts have been made to reduce the warpage of the package; however they require additional, often expensive process steps. Material shaving a low coefficient of thermal expansion, like molybdenum, combinations of metals like copper-invar-copper, or other exotic organic reinforcements such as Kevlar, have been employed in packages to reduce the coefficient of thermal expansion. Kevlar, however, absorbs moisture. Copper-invar-copper is expensive and difficult to drill. Molybdenum is expensive, tough to drill, and hard to etch with conventional etchants.

Attachments such as stiffeners or encapsulants on top of the chip are often employed to counteract warpage. However, encapsulants and top stiffeners add extra processing steps, cost, complexity and they occupy additional space.

Instead of glass cloth in the dielectric layers of a package, woven quartz cloth has been used in an attempt to lower the coefficient of thermal expansion. However, dielectric which employs woven quartz cloth is thick and heavy which limits the usefulness of the prepreg. Furthermore, laminates made with such quartz prepreg are difficult to drill due to the hardness of the quartz and the thickness of the quartz yarn bundles.

While the coefficient of thermal expansion of dielectric layers having resin as a base can be reduced by reducing the resin content, substantial reductions in resin content effect the designed dielectric performance by increasing the dielectric constant of the material, which often necessitates a compensating design change in the package or the dielectric itself.

It would be desirable to be able to reduce the warpage of chip attach packages by a method which does not employ expensive, difficult to drill materials.

SUMMARY OF THE INVENTION

The present invention provides a simple, inexpensive, drillable, reduced CTE laminate and circuitized structures comprising the reduced CTE laminate. The reduced CTE laminate comprises: from about 40% to 75%, preferably from about 55% to 65%, by weight resin; from about 0.05% to 0.3%, preferably from about 0.08% to 0.10%, by weight curing agent; from about 25% to 60%, preferably from about 30% to 40%, by weight, woven cloth; from about 1% to 15%, preferably from about 5% to 10%, by volume, non-woven quartz or non-woven glass mat.

The present invention also generally relates to a method for reducing the CTE of circuitized structures, and to methods for making reduced CTE laminate and circuitized structures comprising reduced CTE laminate.

The method for making reduced CTE laminate comprises the following steps: providing non-woven quartz or non-woven glass mat; providing a prepreg, preferably B-stage cured to not more than about 40%, more preferably not more than 30%, most preferably not more than 20% of full cure; sandwiching the non-woven mat between two layers of prepreg, and reflowing the resin of the prepreg into the non-woven mat. Optionally, the reduced CTE laminate is sandwiched between two layers of metal, preferably copper.

DETAILED DESCRIPTION OF THE INVENTION

Figure 1:
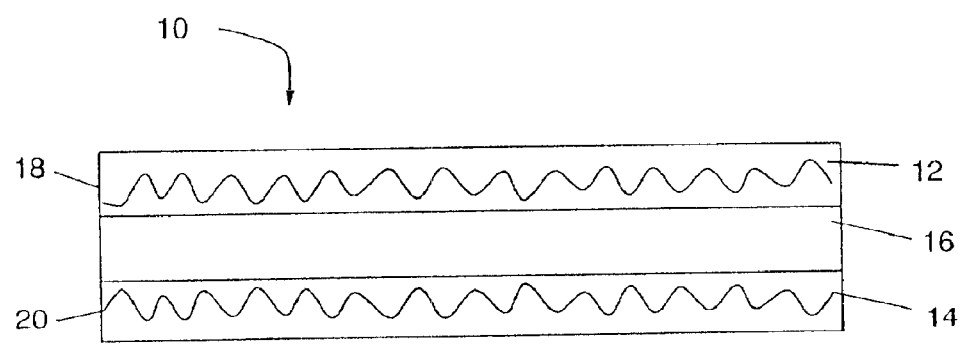
FIG. 1 is a cross sectional drawing of the reduced CTE laminate.

The present invention provides a simple, inexpensive, drillable, reduced CTE laminate and circuitized structures comprising the reduced CTE laminate. The reduced CTE laminate comprises: from about 40% to 75%, preferably from about 55% to 65%, by weight resin; from about 0.05% to 0.3%, preferably from about 0.08% to 0.10%, by weight curing agent; from about 25% to 60%, preferably from about 30% to 40%, by weight, woven cloth; from about 1% to 15%, preferably from about 5% to 10%, by volume, non-woven quartz fiber mat.

The present invention also generally relates to a method for reducing the CTE of circuitized structures, and to methods for making reduced CTE laminate and circuitized structures comprising reduced CTE laminate.

The method for making reduced CTE laminate comprises the following steps: providing non-woven quartz fiber mat; providing a prepreg, preferably B-stage cured to not more than about 40%, more preferably not more than 30%, most preferably not more than 30% and not less than 5%, preferably not less than 10%, of full cure; sandwiching the non-woven mat between two layers of prepreg, and reflowing the resin of the prepreg into the nonwoven mat.

A particular advantage of the present invention is that the non-woven mat can be incorporated during the assembly of an otherwise conventional laminate, to lower the CTE of the laminate. Thus, conventional laminates which have already been designed for use in a particular circuitized structure or use in a particular manufacturing line, do not have to be redesigned, or reengineered in order to lower the CTE, as would be necessitated with other methods of lowering the CTE in the laminate.

A further advantage of the present reduced CTE laminate is that additional resin need not be employed beyond the amount used in conventional laminates. In addition, the overall thickness of the reduced CTE laminate is not increased significantly, and thus the thickness of packages which comprise the reduced CTE laminate are not increased significantly.

The CTE of the reduced CTE laminate is adjusted as desired, preferably by varying the weight, density, or the number of plies of the non-woven mat employed. To lower the CTE of a laminate, the "amount" of the non-woven mat is determined based on the amount of glass cloth and the amount of resin to be present in the laminate.

In one embodiment of the invention, the CTE of the reduced CTE laminate is determined according to the following formula, designated "formula A", a weighted average for determining VOL and/or CTE:

$$CTE_{comp/\atop CORE} = \frac{\begin{array}{c}(CTE_R)(MOD_R)(VOL_R) + (CTE_G)(MOD_G)(VOL_G) + \\ (CTE_C)(MOD_C)(VOL_C) + (CTE_Q)(MOD_Q)(VOL_Q)\end{array}}{\begin{array}{c}(MOD_R)(VOL_R) + (MOD_G)(VOL_G) + \\ (MOD_C)(VOL_C) + (MOD_Q)(VOL_Q)\end{array}}$$

where:
 $CTE_R$=CTE of the resin,
 $MOD_R$=modulus of resin,
 $VOL_R$=Volume fraction of resin,
 $CTE_G$=CTE of woven glass cloth,
 $MOD_G$=Modulus of woven glass cloth,
 $VOL_G$=Volume fraction of glass cloth,
 $CTE_C$=CTE of copper,
 $MOD_C$=Modulus of copper,
 $VOL_C$=Volume of fraction of copper,
 $CTE_Q$=CTE of mat fiber, quartz,
 $MOD_Q$=Modulus of mat fiber, quartz,
 $VOL_Q$=Volume fraction of fiber mat.

The Modulus values are intrinsic to their respective materials, as is well known in the art. The volume fractions are determined by measuring the volume of each component and calculating the volume fraction.

The above formula expressed as formula B, can also be employed to calculate the amount of non-woven quartz mat needed to be added to a laminate and/or laminate structure to arrive at a desired CTE for the package. Thus, if a package CTE of X is desired, the $VOL_Q$ is obtained by the following formula B:

$$VOL_Q = \frac{\begin{array}{c}(CTE_R)(MOD_R)(VOL_R) + (CTE_G)(MOD_G)(VOL_G) + \\ (CTE_C)(MOD_C)(VOL_C) - (CTE_{COMP})(MOD_R)(VOL_R) - \\ (CTE_{COMP})(MOD_G)(VOL_G) - (CTE_{COMP})(MOD_C)(VOL_C)\end{array}}{(CTE_{COMP})(MOD_Q) - (CTE_Q)(MOD_Q)}$$

Typical values of the factors of one embodiment of the invention are:
 $CTE_R$=CTE of the resin, is 69 ppm°/C.
 $MOD_R$=modulus of resin, is 6.5 GPA
 $VOL_R$=Volume fraction of resin is 51.3%
 $CTE_G$=CTE of E-glass woven glass is 5.5 ppm°/C.
 $MOD_C$=modulus of E-glass woven cloth is 70 GPA
 $VOL_E$=Volume fraction of glass cloth is 31.9%
 $CTE_C$=CTE of copper is 17 ppm°/C.
 $MOD_C$=modulus of copper is 117 GPA
 $VOL_C$=Volume of fraction of copper is 10.21%
 $CTE_Q$=CTE of non woven mat fiber, quartz, is 0.54 ppm°/C.
 $MOD_Q$=Modulus of mat fiber, quartz is 70 GPA
 $VOL_Q$=Volume fraction of fiber mat is 6.6%

The CTE reduction is achieved by adding single or multiple non-woven quartz mats during the fabrication of the reduced CTE laminate or reduced CTE laminate structure.

The Non-Woven Mat

The non-woven mat is non-woven quartz mat or non-woven glass mat. The non-woven mat has randomly oriented fibers held together by binder, preferably from about 5 to 15% binder by weight of the mat. Preferably the binder is for example epoxy resin or polyvinyl alcohol. Preferably the fibers have an average length of about 0.25 inch up to 3 inches, more preferably about 0.5 inches, and preferably have an average diameter of from about 5 to 12, more preferably from about 6 to 10, most preferably about 9 microns. The non-woven mats preferably have a weight per unit area of from about 10 g/m² to 80 g/m², more preferably about 17 g/m² to 34 g/m². The non-woven mats prior to being impregnated with resin, have preferably at least about 50%, more preferably at least about 75%, void space. Preferably, the non-woven mats have no more than about 95% void space prior to being impregnated with resin.

After the non-woven mats are impregnated with resin, the void spaces are substantially filled with resin to form a resin filled matrix which surrounds the mat fibers. However, when insufficient amount of prepreg is used in relation to the non-woven mat fiber or conversely an excess of non-woven mat fiber is used in relation to the resin, insufficient resin from the prepreg is available to fill the void spaces which are initially present in the non-woven mat. As a result some void spaces remain in the resin impregnated mat; such void spaces in the resin impregnated mat are referred to herein as "voids". Voids present in the circuitized structure detract from the electrical insulation resistance reliability of such structure. Preferably, the reduced CTE laminate and thus the circuitized structure into which the reduced CTE laminate is incorporated, has from 0–5%, more preferably from about 0 to 2% by volume, voids, from about 70 to 90% by volume matrix, and from about 5 to 30% by volume quartz fiber.

The Prepreg

The prepreg formulation is conventional; the prepreg has a resin content of from about 40% to about 75%, preferably from about 55% to 65% by weight, and a woven cloth content of from about 25 to 65%, preferably from about 20% to 30% by weight. Optionally a cure accelerator is used. The resins are conventional thermoset resins employed in prepreg including for example, epoxy resin, polyimide resins, triazine resins, bis-maleimide-triazine resins, and cyanate ester resins. Suitable epoxy resin is available under the designation "LZ8213" from Ciba Geigy Company. The woven cloth serves as a reinforcement and as a resin carrier. The woven cloth is conventional, and includes for example, cloth composed of non-conductive organic fibers, inorganic fiber such as glass, alumina fiber, S, D, K and E Glass. E Glass is particularly suitable; it is composed of from about 52 to 56% by weight silicon dioxide, from about 16 to 25% by weight calcium oxide, from about 12 to 16% by weight aluminum oxide, from about 8 to 13% by weight boron oxide, from about 0 to 1% by weight sodium oxide and potassium oxide, and from about 0 to 6% by weight magnesium oxide. Woven cloth is preferred because it absorbs less resin, and because it provides better dimensional stability than a non-woven material. Suitable "E glass" is the 1080 style, which is commercially available. Suitable curing accelerators are conventional such as, for example, 2-methylimidazole, BMDA, TMBDA, 2-ethyl-4-methylimidazole, 2-phenylimidazole.

Method of Forming Prepreg

The prepreg is made according to conventional techniques. The glass cloth is coated, or impregnated, with the resin by dipping or otherwise passing the glass cloth through a solution containing the resin, solvent, and a curing agent. The resin impregnated glass cloth is then run through metering rolls to remove excess resin. The resin impregnated glass cloth is then dried in an oven at from about 120–170° C., to remove the solvent and at the same time to effect a B-stage cure. B-stage cure is a partial cure of the resin. Conventionally, the prepreg is b-stage cured to about 30 to 40%; however to make the laminates of the present invention, it is preferred that the prepreg is only about 20 to 30% cured.

Method of Forming Reduced CTE Laminate

Preferably the non-woven mat is sandwiched, preferably by lamination, more preferably by vacuum lamination, between two layers of prepreg and the prepreg is heated for sufficient time and temperature so that the resin in the prepreg reflows and flows into the mat, wetting the mat. Methods which involve immersing the non-woven mat in a solution of resin are less preferred since the non-woven mat absorbs excessive resin.

Preferably the non-woven mat is applied to the prepreg by lamination, more preferably vacuum lamination. The initial vacuum of the lamination cycle removes the air trapped in the void spaces of the non-woven mat. The open, low density nature of the non-woven mat allows the resin to flow in and surround the fibers of the non-woven mat. Since the non-woven mat is sparsely populated with fibers it wets well; this "dry impregnation" is not possible with ordinary woven fabrics which have yarns composed of hundreds of parallel fibers. Preferably the lamination is at about 180 to 300° C. and pressures of about 500 to 1000 psi. Good results have been obtained by vacuum lamination at 185° C., and 750 psi. The resulting reduced CTE laminate is shown in FIG. 1.

As shown in FIG. 1, reduced CTE laminate 10 is comprised of prepreg layers 12 and 14, and non-woven mat 16 disposed between prepreg layers 12 and 14. Prepreg layers 12 and 14 contain glass layers 18 and 20.

Figure 2:
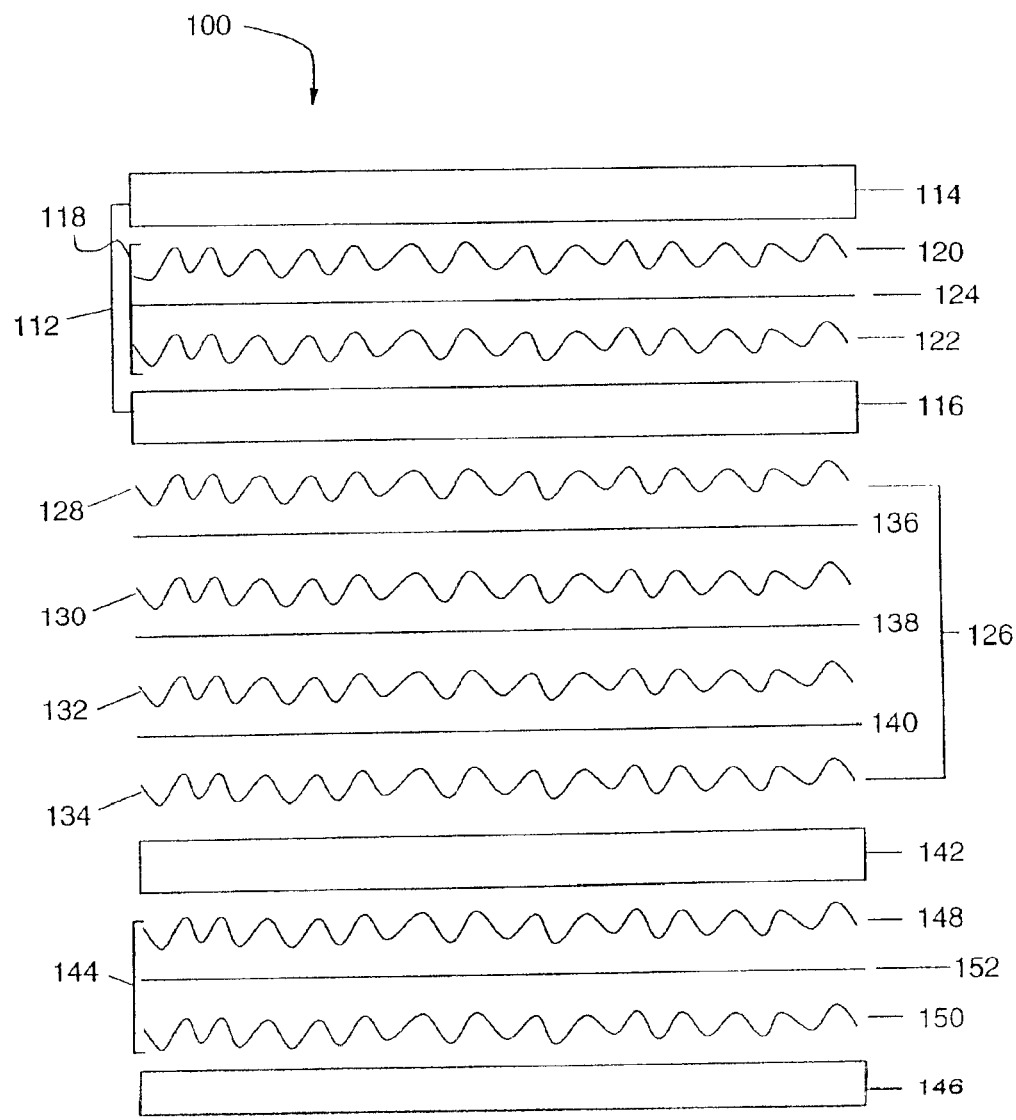
FIG. 2 is a cross sectional drawing of a circuitized structure containing the reduced CTE laminate structure.

Reduced CTE laminate is typically further laminated to additional layers of prepreg, copper foil and optionally additional layers of non-woven mat, to form laminate structures such as, for example, cores or composites. The reduced CTE laminate and/or the laminate structures are then used to fabricate circuitized structures such as, for example, printed circuit boards, cards, chip carriers, organic single chip modules, organic multi-chip modules, and interposer cards by employing conventional techniques. For example, as shown in FIG. 2, a circuitized structure 100 is comprised of laminate structure 112, which is comprised of a signal layer 114 and power or ground plane layer 116; dielectric layer 118, which is disposed between signal layer 114 and power or ground plane layer 116, is comprised of prepreg layers 120 and 122. Preferably non-woven mat 124 is disposed between prepreg layers 120 and 122. Adjacent to the circuitry layer 116 is the core 126 which is comprised of prepreg layers 128, 130, 132 and 134. Preferably non-woven mats 136, 138 and 140 are interspersed between the glass layers 128, 130, 132 and 134 of the core 126. Power or ground plane layer 142 is disposed adjacent to prepreg layer 134. Dielectric layer 144 is disposed between tower or ground plane layer 142 and signal layer 146. Dielectric layer 144 is comprised of glass layers 148 and 150, preferably non-woven mat 152 is interspersed between prepreg layers 148 and 150. Signal layer 114 and power or ground plane layers 116 and 142 are interconnected by conventional structures such as conductive through holes and vias, not shown. Chip (not shown) is disposed atop layer 114.

The following examples are illustrative and not intended to limit the scope of the invention.

EXAMPLE 1

Prepreg was fabricated to provide a prepreg having about 60% by weight epoxy resin, 0.1% by weight curing accelerator 2-methyl imidizole and 40% by weight E-glass 1080, and b-stage cured to about 20 to 30%. Next, a multilayered structure was assembled which comprised a layer of copper sheet, a first layer of prepreg atop the copper, a second layer of prepreg atop the first layer of prepreg, a layer of non-woven quartz mat, a third and fourth layer of prepreg and finally a second layer of copper sheet. The non-woven quartz mat was about 0.004 inches thick before lamination, had a weight per unit area of about 17 $g/m^2$ and was obtained from Technical Fiber Products Company. The multilayered structure was then vacuum laminated in a Wabash lamination press, at 185° C. for about 120 minutes at around 750 psi, to provide a reduced CTE laminate, in this case a laminate core. The copper layers on the outside of the core were then etched to form the circuit features using conventional techniques.

Then a laminate structure comprising the circuitized laminated core was fabricated which comprised an outside, third layer of copper, a fifth and sixth layer of prepreg, having about 67% resin, adjacent to the third layer of copper, and the circuitized laminate core positioned adjacent to the sixth layer of prepreg. Atop the circuitized core were a seventh and eighth layer of prepreg and fourth layer of copper sheet adjacent to the seventh and eight layer of prepreg. The multi-layered structure was then placed in the vacuum lamination press for about 120 minutes, at 185° C. and 750 psi to provide a laminate structure.

The CTE of the resulting laminate structure was measured and found to be 18.52 ppm/° C. in the x-y direction and 60 ppm/° C. in the z direction. The resulting laminate structure had a total thickness of about 25.9 mils.

EXAMPLE 2

A reduced CTE laminate structure was made as in example 1, except that the core lacked a non-woven mat. Instead a non-woven quartz mat was employed between the fifth and sixth prepreg layers, and between the seventh and eight prepreg layers, so that 2.3% rather than 1.2% of the laminate structure was quartz non-woven mat. The resulting composite structure had a total thickness of about 26.2 mils.

EXAMPLE 3

A reduced CTE laminate structure was made as in example 1, except that a non-woven quartz mat was also employed between the fifth and sixth prepreg layers, and between the seventh and eight prepreg layers, so 3.4% rather than 1.2% of the laminate was quartz non-woven mat. The resulting laminate structure had a total thickness of about 26.5 mils.

EXAMPLE 4

A reduced CTE laminate was made as in example 2, except that a non-woven quartz mat was employed between the first and second prepreg layers, and between the third and fourth prepreg layers, so 4.5% rather than 1.2% of the laminate was quartz non-woven mat. The resulting laminate had a total thickness of about 26.8 mils.

EXAMPLE 5

A reduced CTE laminate was made as in example 3, except that a non-woven quartz mat was employed between the first and second prepreg layers, and between the third and fourth prepreg layers, so 5.6% rather than 1.2% of the laminate was non-woven quartz mat. The resulting laminate had a total thickness of about 27.1 mils.

EXAMPLE 6

A reduced CTE laminate structure was made as in example 1 except that a thicker non-woven quartz mat was employed. The weight per unit area of the mat was 34 $g/m^2$ rather than 17 $g/m^2$. Thus, 2.3% rather than 1.2% of the laminate structure was quartz non-woven mat. The resulting laminate structure had a total thickness of about 26.2 mils.

EXAMPLE 7

A reduced CTE laminate structure composite was made as in example 2 except that a thicker non-woven quartz mat was employed. The weight per unit area of the mat was 34 g/m² rather than 17 g/m². Thus, 4.5% rather than 2.3% of the laminate structure was quartz non-woven mat. The resulting structure laminate structure had a total thickness of about 26.8 mils.

EXAMPLE 8

A reduced CTE laminate was made as in example 3 except that a thicker non-woven quartz mat was employed. The weight per unit area of the mat was 34 g/m² rather than 17 g/m². Thus, 6.6% rather than 3.4% of the composite laminate was quartz non-woven mat. The resulting laminate structure had a total thickness of about 27.4 mils.

EXAMPLE 9

A reduced CTE laminate was made as in example 4 except that a thicker non-woven quartz mat was employed. The weight per unit area of the mat was 34 g /m² rather than 17 g/m². Thus, 8.6% rather than 4.5% of the laminate structure was quartz non-woven mat. The resulting laminate structure had a total thickness of about 28.0 mils.

EXAMPLE 10

A reduced CTE laminate was made as in example 5 except that a thicker non-woven quartz mat was employed. The weight per unit area of the mat was 34 g/m² rather than 17 g/m². Thus, 10.6% rather than 5.6% of the laminate structure was quartz non-woven mat. The resulting laminate structure had a total thickness of about 28.6 mils.

Comparative Example A

A conventional prepreg was made as in example 1 except the resin was cured to 30–40%. The laminate structure was made as in example 1 except without non-woven quartz mat. The CTE of this conventional laminate composite was 19.01 ppm/° C. in the x-y direction and 65 ppm/° C. in the x-y direction and 65 ppm/° C. in the z direction. The thickness was 25.6 mils.

TABLE I

EFFECT OF NON-WOVEN MAT ON CTE

| Example | % Quartz Mat (volume) | CTE (ppm/° C.) | CTE Delta |
|---|---|---|---|
| control/comp A | 0 | 19.01 | |
| 1 | 1.2 | 18.52 | -0.49 |
| 2 | 2.3 | 18.06 | -0.95 |
| 3 | 3.4 | 17.61 | -1.4 |
| 4 | 4.5 | 17.20 | -1.81 |
| 5 | 5.6 | 16.79 | -2.22 |
| 6 | 2.3 | 18.06 | -0.95 |
| 7 | 4.5 | 17.20 | -1.81 |
| 8 | 6.6 | 16.41 | -2.60 |
| 9 | 8.6 | 15.70 | -3.31 |
| 10 | 10.6 | 15.04 | -3.97 |

As can be seen from Table 1, the non-woven quartz mat reduced the CTE of each of the laminate composites or each of the examples. As shown in example 10, by incorporating the non-woven mat at several places in the laminate structure, a reduction of about 4 ppm is achieved. Even a reduction of 1 or 2 ppm in the coefficient of thermal expansion of the composite laminate can significantly reduce the amount of warpage in the chip carrier package.

Thus, by incorporating a non-woven quartz mat into the laminate and or laminate structure, the coefficient of thermal expansion in the laminate and/or laminate structure is reduced thereby improving the function of the overall package.

What is claimed is:

1. A method for fabricating circuitized structures, comprising the following steps:
   a. providing a prepreg comprised of woven cloth impregnated with a resin and B-stage cured to not greater than about 20%;
   b. providing a non-woven quartz or non-woven glass mat having a weight per unit area of less than about 34 grams/meters² and a void space content greater than about 50%; and
   c. laminating the non-woven mat between two layers of the prepreg to reflow the resin so as to impregnate the non-woven mat with resin.

2. The method of claim 1, wherein the lamination is vacuum lamination.

3. The method of claim 1, wherein the mat void space content is greater than about 75%.

4. The method of claim 1, wherein the mat void space content is greater than about 95%.

5. The method of claim 1, wherein the non-woven mat is a non-woven quartz mat.

6. The method of claim 1, wherein the non-woven mat is a non-woven glass mat.

7. The method of claim 1, wherein the two layers of prepreg are B-stage cured to not more than about 30%.

8. The method of claim 1, wherein the two layers of prepreg are B-stage cured to not more than about 40%.

9. The method of claim 1, wherein the non-woven mat has a weight and comprises randomly oriented fibers held together by a binder, said binder comprising from about 5 to 15% of the non-woven mat weight.

10. The method of claim 9, wherein the fibers have an average length of from about 0.25 to about 3.0 inches.

11. The method of claim 1, wherein the fibers have an average diameter of from about 5 to 12 microns.

12. The method of claim 1 wherein the step of providing a non-woven mat comprises providing a single mat.

13. The method of claim 1 wherein the step of providing a non-woven mat comprises providing a plurality of mats.

14. The method of claim 1 wherein the resin is an epoxy resin.

15. The method of claim 1 wherein the woven cloth is E-glass.

16. The method of claim 1 wherein the non-woven mat has a percent void space of from about 50 to 95% by volume.

17. The method of claim 1, wherein the prepreg further comprises a curing agent, and the step of laminating the non-woven mat includes the step of impregnating the non-woven mat with resin to form a resin-filled matrix with from about 10 to 30% by volume of fiber and from about 70 to 90% by volume resin, and further comprising the step of the prepreg layers and the non-woven mat forming a resultant laminate structure with a total weight, said resin comprising from about 40 to 75% of said total weight, said woven cloth comprising from about 25 to 60% of said total weight, said non-woven mat comprising from about 1 to 15% or said total weight and said curing agent comprising from about 0.05 to 0.3% of said total weight.

18. The method of claim 1 wherein the non-woven mat has a weight per unit area of about 17 grams/meters².

* * * * *